United States Patent
Li et al.

(10) Patent No.: US 7,674,658 B2
(45) Date of Patent: Mar. 9, 2010

(54) SEMICONDUCTOR DEVICE AND MANUFACTURING METHOD THEREOF

(75) Inventors: Chen-Yueh Li, Hsinchu (TW); Yi-Wei Chen, Hsinchu (TW); Ming-Yan Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 2 days.

(21) Appl. No.: 12/025,057

(22) Filed: Feb. 4, 2008

(65) Prior Publication Data

US 2008/0283923 A1    Nov. 20, 2008

(30) Foreign Application Priority Data

May 15, 2007    (TW) ................................ 96117303 A

(51) Int. Cl.
*H01L 21/00* (2006.01)
*H01L 29/10* (2006.01)

(52) U.S. Cl. .................. 438/149; 438/373; 438/517; 257/66; 257/E27.111; 257/E21.413; 257/E21.433

(58) Field of Classification Search ............... 438/149, 438/197, 517, 527; 257/66, E27.111, E27.081, 257/E27.059, E27.046, E27.06, E21.4, E21.411, 257/E21.412, E31.413, E21.415, 424, E21.433, 257/E21.437, 285

See application file for complete search history.

(56) References Cited

U.S. PATENT DOCUMENTS

| | | | |
|---|---|---|---|
| 6,664,145 B1 | 12/2003 | Yamazaki et al. | |
| 6,846,707 B2 | 1/2005 | Chang | |
| 6,902,961 B2 | 6/2005 | Chang et al. | |
| 7,064,021 B2 | 6/2006 | Chang | |
| 7,374,983 B2 * | 5/2008 | Okamoto, Satoru | ......... 438/163 |
| 2006/0118888 A1 * | 6/2006 | Isikawa | ...................... 257/395 |

* cited by examiner

*Primary Examiner*—Caridad M Everhart
(74) *Attorney, Agent, or Firm*—Jianq Chyun IP Office

(57) ABSTRACT

A semiconductor device and a manufacturing method thereof are provided. The manufacturing method can form a structure of a thin film transistor (TFT) having a symmetric lightly doped region, and thus provide superior operation reliability and electrical performance. In addition, the manufacturing method forms gate patterns of different TFTs by the same mask process and thereby avoids the misalignment of masks so as to improve the processing yield and reduce the manufacturing cost.

39 Claims, 11 Drawing Sheets

SEMICONDUCTOR DEVICE AND MANUFACTURING METHOD THEREOF

CROSS-REFERENCE TO RELATED APPLICATION

This application claims the priority benefit of Taiwan application serial no. 96117303, filed on May 15, 2007. The entirety of the above-mentioned patent application is hereby incorporated by reference herein and made a part of this specification.

BACKGROUND OF THE PRESENT INVENTION

1. Field of the Invention

The present invention relates to a semiconductor device and a manufacturing method thereof, and more particularly, the present invention relates to a structure of a thin film transistor (TFT) applicable to a liquid crystal display (LCD) panel and a manufacturing method of the TFT structure.

2. Description of Related Art

Since the polysilicon thin film transistor (poly-Si TFT) has advantages such as low power consumption and high electron mobility compared with the amorphous silicon thin film transistor (a-Si TFT), the low temperature polysilicon thin film transistor (LTPS-TFT) has been extensively adopted in large-sized liquid crystal displays (LCDs).

Referring to FIG. 1, which is a schematic cross-sectional view illustrating a conventional LTPS-TFT. As illustrated in FIG. 1, a buffer layer 102 is formed on the substrate 100, and a polysilicon layer 110 is formed on the buffer layer 102. The polysilicon layer 110 includes a source region 112 and a drain region 114 formed by a doping process, and a channel region 116 is located between the source region 112 and the drain region 114.

Still referring to FIG. 1, a gate insulation layer 120 covers the polysilicon layer 110 and the buffer layer 102, and a gate 130 is disposed on the gate insulation layer 120 over the channel region 116. A dielectric layer 140 covers the gate 130 and the gate insulation layer 120, and contact windows 112a and 114a are formed in the dielectric layer 140 and the gate insulation layer 120. In addition, a source metal layer 152 and a drain metal layer 154 are disposed on the dielectric layer 140. The source metal layer 152 and the drain metal layer 154 are electrically connected to the source region 112 and the drain region 114 through the contact windows 112a and 114a respectively.

It should be noted that in order to lower a lateral electric field during operation of transistors so as to increase the reliability of devices and reduce the possibility of current leakage, a lightly doped drain (LDD) region 118 is usually formed among the source region 112, the drain region 114 and the channel region 116. During a conventional manufacturing process of a polysilicon TFT having the LDD region 118, it usually takes more than two mask processes and more than two doping processes to form the source region 112, the drain region 114 and the LDD region 118 with different dopant concentrations. However, the aforesaid method of manufacturing an LDD region not only has a more complicated manufacturing process but also creates more difficulty in aligning mask patterns, such that the formed TFTs have different electrical performances and thereby affects the reliability of products.

SUMMARY OF THE INVENTION

The present invention is related to a manufacturing method of a semiconductor device, which reduces the number of masks in process to lower the manufacturing cost and improve the processing yield.

The present invention is further directed to a semiconductor device having high reliability and superior electrical performance.

In order to specifically describe the invention, a manufacturing method of a semiconductor device is provided herein. First, a substrate is provided, and a first semiconductor pattern and a second semiconductor pattern are formed thereon. Afterwards, a gate insulation layer and a gate metal layer are sequentially formed on the substrate to cover the first semiconductor pattern and the second semiconductor pattern. Next, a first mask pattern and a second mask pattern are formed on the gate metal layer. The first mask pattern is located over the first semiconductor pattern and exposes a first source/drain region of the first semiconductor pattern correspondingly. The second mask pattern is located over the second semiconductor pattern and exposes a second source/drain region of the second semiconductor pattern correspondingly. Thereafter, the gate metal layer is patterned to form a first gate pattern and a second gate pattern respectively using the first mask pattern and the second mask pattern as masks. Then, a first type ion doping process is performed on the first source/drain region and the second source/drain region using the first mask pattern, the first gate pattern, the second mask pattern and the second gate pattern as masks so that the first source/drain region and the second source/drain region have a first conductive state. Next, an etching process is performed on the first mask pattern and the second mask pattern to remove a portion of exterior walls of the first mask pattern and the second mask pattern so that a portion of the first gate pattern and a portion of the second gate pattern are exposed. Afterwards, the first gate pattern and the second gate pattern are etched to form a first gate and a second gate using the first mask pattern and the second mask pattern as masks after their exterior walls being partially removed. Furthermore, a first lightly doped region beside the first source/drain region in the first semiconductor pattern and a second lightly doped region beside the second source/drain region in the second semiconductor pattern are exposed correspondingly. Then, a first type ion light doping process is performed in the first lightly doped region and the second lightly doped region using the first gate and the second gate as masks so that the first lightly doped region and the second lightly doped region have a first conductive state. Thereafter, the first mask pattern and the second mask pattern are removed to form a patterned mask layer on the substrate. The patterned mask layer exposes a portion of the second semiconductor pattern correspondingly. After that, a second type ion counter-doping process is performed in the second source/drain region and the second lightly doped region using the patterned mask layer so as to transform the conductive state of the second source/drain region and the second lightly doped region from a first conductive state to a second conductive state. Next, the patterned mask layer is removed.

According to one embodiment of the present invention, the aforementioned manufacturing method of a semiconductor device after removing the patterned mask layer further includes forming a dielectric layer on the gate insulation layer to cover the first gate and the second gate. Afterwards, a plurality of first contact windows is formed in the dielectric layer and the gate insulation layer. The first contact windows expose the first source/drain region of the first semiconductor pattern and the second source/drain region of the second semiconductor pattern. Subsequently, a first source/drain contact metal and a second source/drain contact metal are formed respectively in the first contact windows. The first source/drain contact metal and the second source/drain contact metal are electrically connected to the first source/drain region and the second source/drain region correspondingly.

After the aforesaid step, a planar layer is further formed on the dielectric layer to cover the first source/drain contact metal and the second source/drain contact metal in the present invention. Then, a second contact window is formed in the planar layer to expose the first source/drain contact metal. Moreover, an electrode pattern is formed on the planar layer and electrically connected to the first source/drain contact metal through the second contact window.

After the aforementioned step, a third mask pattern is formed simultaneously on the gate metal layer in the present invention when the first mask pattern and the second mask pattern are formed. Then, when the gate metal layer is patterned using the first mask pattern and the second mask pattern as masks, the third mask pattern is simultaneously used as a mask to pattern the gate metal layer so as to form a lower bonding pad. Additionally, in the present invention, the dielectric layer is further formed to cover the lower bonding pad. Next, when forming the first contact windows, a third contact window is further formed in the dielectric layer to expose the lower bonding pad. After that, when forming the first source/drain contact metal and the second source/drain contact metal, an upper bonding pad is formed in the third contact window and the upper bonding pad is electrically connected with the lower bonding pad. Moreover, when formation of the planar layer in the present invention, the planar layer may further cover the upper bonding pad. Afterwards, a fourth contact window is further formed in the planar layer when forming the second contact window and the fourth contact window exposes the upper bonding pad. In addition, when forming the electrode pattern on the planar layer, a bonding pad pattern is formed in the fourth contact window to connect with the upper bonding pad.

The present invention also provides another manufacturing method of a semiconductor device. First, a substrate is provided, and a first semiconductor pattern and a second semiconductor pattern are formed thereon. Next, a second type ion doping process is performed in a second source/drain region of the second semiconductor pattern so that the second source/drain region has a second conductive state. Then, a gate insulation layer is formed on the substrate to cover the first semiconductor pattern and the second semiconductor pattern. Next, a gate metal layer is formed on the gate insulation layer and a first mask pattern and a second mask pattern are formed on the gate metal layer. The first mask pattern is located over the first semiconductor pattern and exposes a first source/drain region of the first semiconductor pattern correspondingly. The second mask pattern is located over the second semiconductor pattern and exposes a portion of the second source/drain region of the second semiconductor pattern correspondingly. Thereafter, the gate metal layer is patterned to form a first gate pattern and a second gate pattern using the first mask pattern and the second mask pattern as masks. Afterwards, a first type ion doping process is performed in the first source/drain region using the first mask pattern and the first gate pattern as masks so that the first source/drain region has a first conductive state while the second source/drain region retains the second conductive state. Next, an etching process is performed on the first mask pattern and the second mask pattern to remove a portion of exterior walls of the first mask pattern and the second mask pattern so that a portion of the first gate pattern and a portion of the second gate pattern are exposed. Thereafter, the first gate pattern and the second gate pattern are etched to form a first gate and a second gate using the first mask pattern and the second mask pattern as masks. The first gate correspondingly exposes a lightly doped region beside the first source/drain region in the first semiconductor pattern and the second gate covers a channel region of the second semiconductor pattern and a portion of the second source/drain region. After that, a first type ion light doping process is performed in the lightly doped region using the first gate as a mask such that the lightly doped region has the first conductive state and the second source/drain region still retains the second conductive state. Subsequently, the first mask pattern and the second mask pattern are removed.

According to one embodiment of the present invention, the manufacturing method of the semiconductor device further includes forming a dielectric layer on the gate insulation layer to cover the first gate and the second gate. Then, a plurality of first contact windows is formed in the dielectric layer and the gate insulation layer. The first contact windows expose the first source/drain region and the second source/drain region. After that, a first source/drain contact metal and a second source/drain contact metal are formed respectively in the first contact windows. The first source/drain contact metal and the second source/drain contact metal are electrically connected to the first source/drain region and the second source/drain region correspondingly.

After the aforesaid step, a planar layer may be further formed on the dielectric layer to cover the source/drain contact metal in the present invention. Then, a second contact window is formed in the planar layer to expose the first source/drain contact metal. Moreover, an electrode pattern is formed on the planar layer and electrically connected to the first source/drain contact metal through the second contact window.

According to one embodiment of the present invention, the manufacturing method of the semiconductor device may further include simultaneously forming a third mask pattern on the gate metal layer during formation of the first mask pattern the second mask pattern. When the gate metal layer is patterned using the first mask pattern and the second mask pattern as masks, the third mask pattern is also used simultaneously as a mask to pattern the gate metal layer to form a lower bonding pad.

Additionally, when forming the dielectric layer in the present invention, the dielectric layer may further cover the lower bonding pad. Next, when forming the first contact window, a third contact window is further formed in the dielectric layer to expose the lower bonding pad. After that, during formation of the first source/drain contact metal and the second source/drain contact metal, an upper bonding pad is formed in the third contact window to connect with the lower bonding pad.

In addition, during formation of the planar layer in the present invention, the planar layer may further cover the upper bonding pad. Furthermore, a fourth contact window is further formed in the planar layer to expose the upper bonding pad during formation of the second contact window. After that, when forming the electrode pattern on the planar layer, a bonding pad pattern is further formed in the fourth contact window to connect with the upper bonding pad.

According to one embodiment of the present invention, the aforesaid step of performing the first type ion doping process in the first source/drain region further includes performing the first type ion doping process in a portion of the second source/drain region. The portion of the second source/drain region still needs to retain the second conductive state. Moreover, when performing the first type ion light doping process in the lightly doped region, the same first type ion light doping process can also be performed in a portion of the second source/drain region simultaneously, and the portion of the second source/drain region still needs to retain the second conductive state.

In one embodiment of the present invention, the manufacturing method of the semiconductor device further includes forming a third semiconductor pattern on the substrate simultaneously during formation of the first semiconductor pattern and the second semiconductor pattern. Afterwards, when performing the second type ion doping process in the second source/drain region, the second type ion doping process is simultaneously performed on the third semiconductor pattern so that the third semiconductor pattern has the second conductive state.

Furthermore, during formation of the first mask pattern and the second mask pattern, a fourth mask pattern may be further formed on the gate metal layer simultaneously. The fourth mask pattern passes over the third semiconductor pattern. Then, when the gate metal layer is patterned using the first mask pattern and the second mask pattern as masks, the fourth mask pattern is also used as a mask to pattern the gate metal layer simultaneously so as to form a metal common electrode. The metal common electrode passes over the third semiconductor pattern. Further, the dielectric layer is formed to further cover the metal common electrode. During formation of the first contact window, a fifth contact window is further formed in the dielectric layer to expose a portion of the third semiconductor pattern. After that, the first source/drain contact metal is formed to further connect with the third semiconductor pattern through the fifth contact window.

The etching process adopted in the plurality of embodiments described above is, for example, a dry etching process. More specifically, the etching process uses, for example, oxygen plasma to etch the first mask pattern and the second mask pattern.

Besides, the substrate applied in the plurality of embodiments described above is, for example, a glass substrate, and a material of the first semiconductor pattern or the second semiconductor pattern may be polysilicon. Moreover, the first type ion is, for example, N-type ion, while the second type ion may be P-type ion. A material of the first mask pattern, the second mask pattern or the patterned mask layer is, for example, a photoresist material.

The present invention further provides a semiconductor device essentially including a substrate, a first semiconductor pattern, a second semiconductor pattern, a gate insulation layer, a first gate and a second gate. The first semiconductor pattern is disposed on the substrate and has a first channel region, a first source/drain region located at two sides of the first channel region and a symmetrical lightly doped region located between the first channel region and the first source/drain region. The first source/drain region and the lightly doped region have a first conductive state. Furthermore, the second semiconductor pattern is disposed on the substrate and has a second channel region and a second source/drain region located at two sides of the second channel region. The second source/drain region has a second conductive state. The gate insulation layer is disposed on the substrate to cover the first semiconductor pattern and the second semiconductor pattern. The first gate is disposed on the gate insulation layer, and the first gate is located over the first semiconductor pattern and exposes the first source/drain region and the lightly doped region correspondingly. The second gate is disposed on the gate insulation layer and located over the second semiconductor pattern to cover the second channel region and a portion of the second source/drain region.

In one embodiment of the present invention, the semiconductor device further includes a dielectric layer, a first source/drain contact metal and a second source/drain contact metal. The dielectric layer is disposed on the gate insulation layer to cover the first gate and the second gate and has a plurality of first contact windows to expose the first source/drain region and the second source/drain region. Further, the first source/drain contact metal and the second source/drain contact metal are disposed in the first contact windows and electrically connected to the first source/drain region and the second source/drain region correspondingly.

The semiconductor device may further include a planar layer and an electrode pattern. The planar layer is disposed on the dielectric layer to cover the first source/drain contact metal and the second source/drain contact metal, and has a second contact window for exposing the first source/drain contact metal. Additionally, the electrode pattern is disposed on the planar layer and coupled to the first source/drain contact metal through the second contact window.

According to one embodiment of the present invention, the semiconductor device further includes a lower bonding pad disposed on the gate insulation layer. Besides, the dielectric layer may further have a third contact window used for exposing the lower bonding pad.

According to one embodiment of the present invention, the semiconductor device further includes an upper bonding pad disposed in the third contact window and electrically connected to the lower bonding pad. Furthermore, the planar layer may further have a fourth contact window to expose the upper bonding pad. A bonding pad pattern may be further formed in the fourth contact window to connect with the upper bonding pad.

According to one embodiment of the present invention, the semiconductor device further includes a third semiconductor pattern disposed on the substrate and covered by the gate insulation layer. The third semiconductor pattern has the second conductive state. Moreover, the third semiconductor pattern is, for example, coupled to the first source/drain region.

In addition, the semiconductor device of the present invention may further include a metal common electrode disposed on the gate insulation layer and passing over the third semiconductor pattern.

The aforesaid substrate is, for example, a glass substrate, and a material of the first semiconductor pattern or the second semiconductor pattern may be polysilicon. The first conductive state is, for example, N-type conductive state, while the second conductive state may be P-type conductive state.

In view of the above, the lightly doped region formed in the TFT structure of the present invention has symmetrical lengths and therefore helps increase the reliability and improve the electrical performance of the devices. Moreover, since the same mask process is applied in the present invention to form devices such as the gate patterns, the metal common electrode and the lower bonding pad of different TFTs, the misalignment of masks prone to arise in the prior art where the said devices are manufactured by different mask processes can be effectively avoided, which helps increase the processing yield and thereby reduce the manufacturing cost.

In order to make the aforementioned and the other objects, features and advantages of the present invention more comprehensible, preferred embodiments accompanied with figures are described in detail below.

DESCRIPTION OF EMBODIMENTS

A manufacturing method of a semiconductor device disclosed in the present invention can be applied in a liquid crystal display (LCD) panel to manufacture a polysilicon thin film transistor (TFT) serving as an active device in a pixel. Moreover, the manufacturing of relevant peripheral devices and external bonding pads in the panel can be simultaneously integrated as well based on the characteristics of the manufacturing process. It is assumed that at least one P-type thin film transistor (PTFT), one N-type thin film transistor (NTFT) and one external bonding pad or even one storage capacitor are simultaneously manufactured in the panel in the following embodiments so as to facilitate illustration of the present invention. However, the embodiments only serve as examples and are not intended to limit the scope to which the present invention may apply. Any similar device structure and manufacturing process in the field of the semiconductor technology may adopt the technology disclosed in the present invention to obtain a better manufacturing effect and higher product quality.

Figure 1:
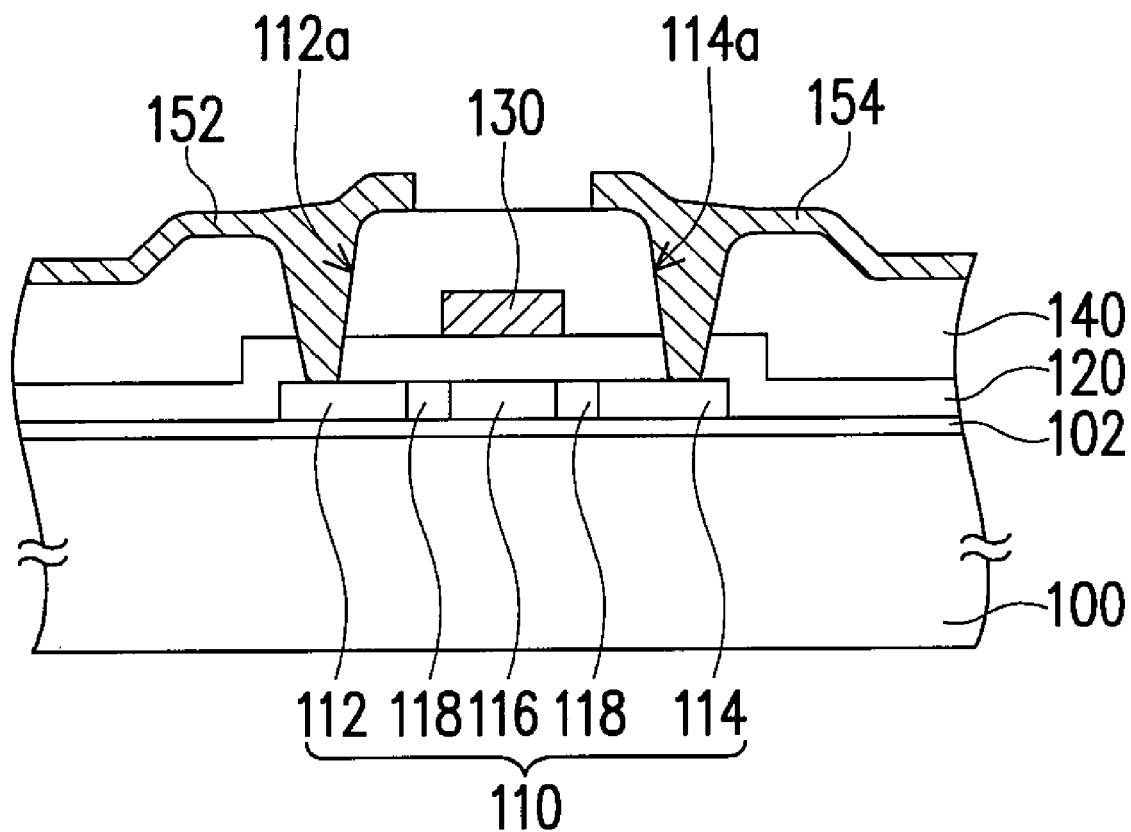
FIG. 1 is a schematic cross-sectional view illustrating a conventional low temperature polysilicon thin film transistor (LTPS-TFT).
Figure 2A:
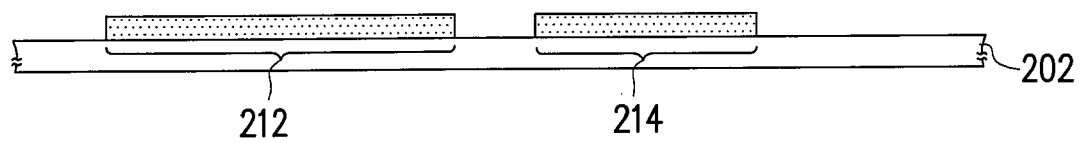
FIGS. 2A through 2O illustrate a manufacturing method of a semiconductor device according to one embodiment of the present invention.
Figure 2B:
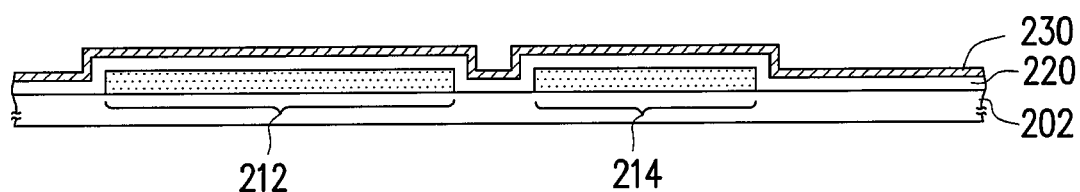
Figure 2C:
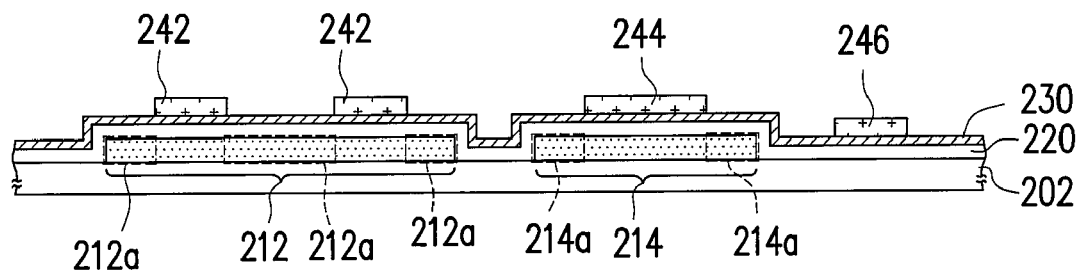
Figure 2D:
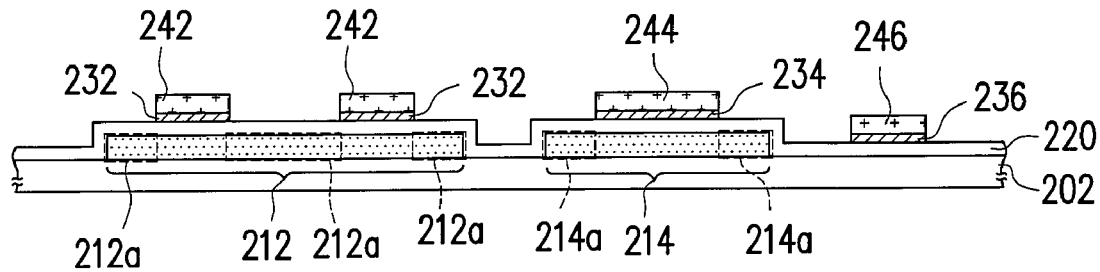
Figure 2E:
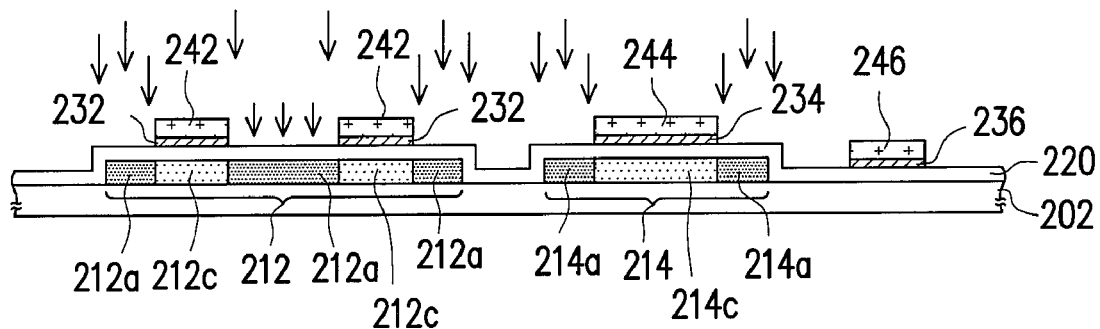
Figure 2F:
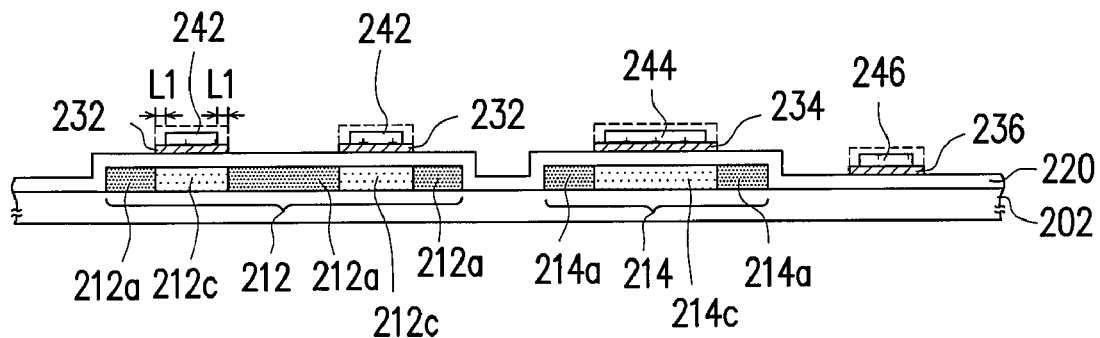
Figure 2G:
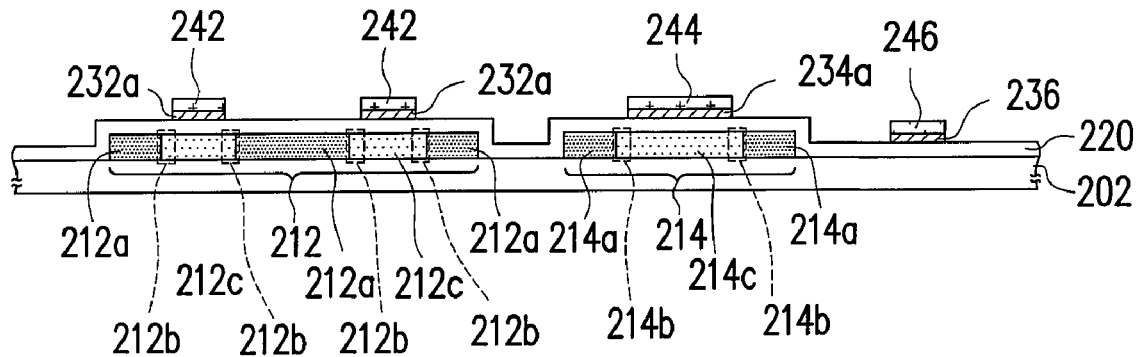
Figure 2H:
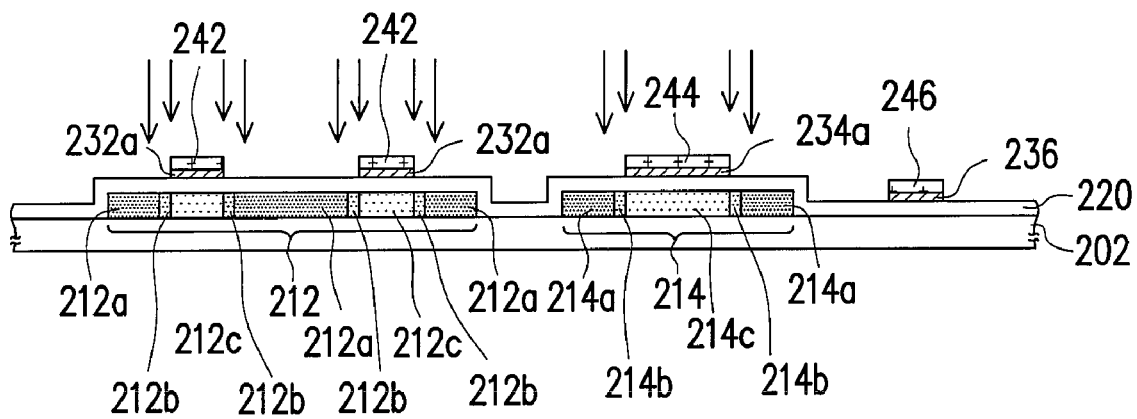
Figure 2I:
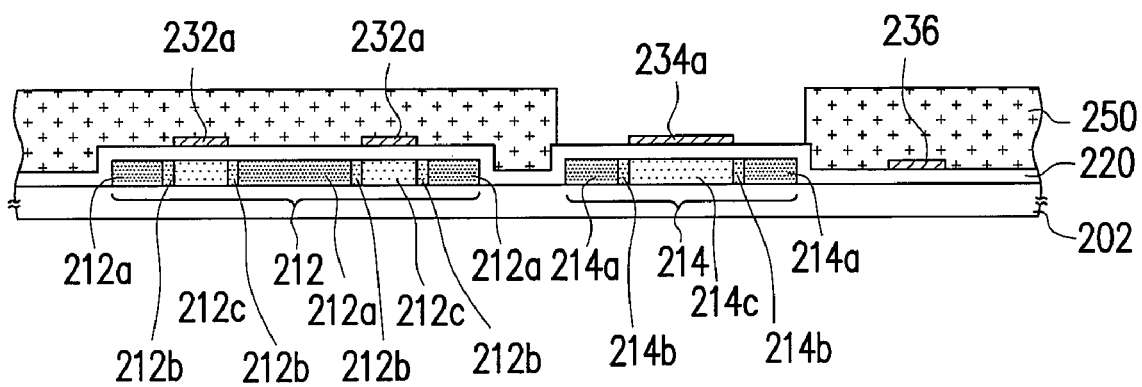
Figure 2J:
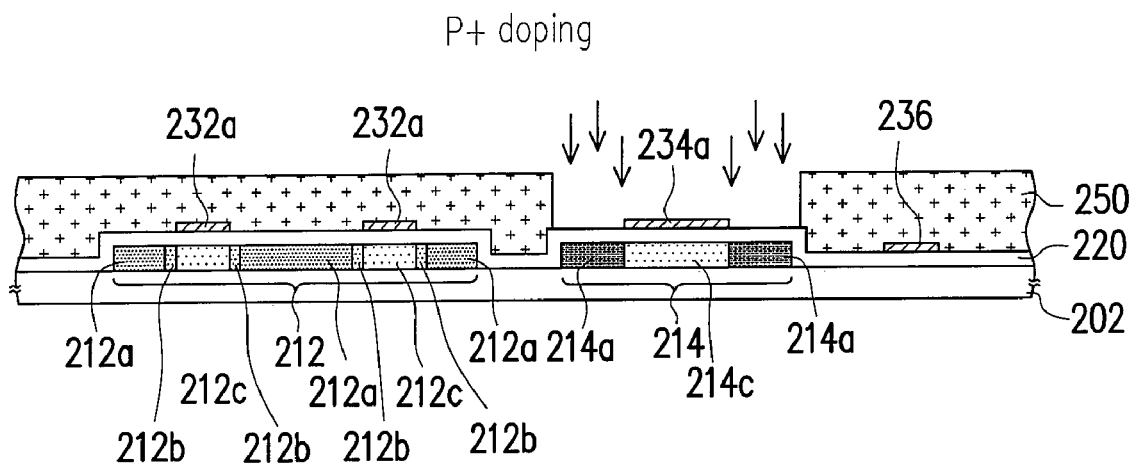
Figure 2K:
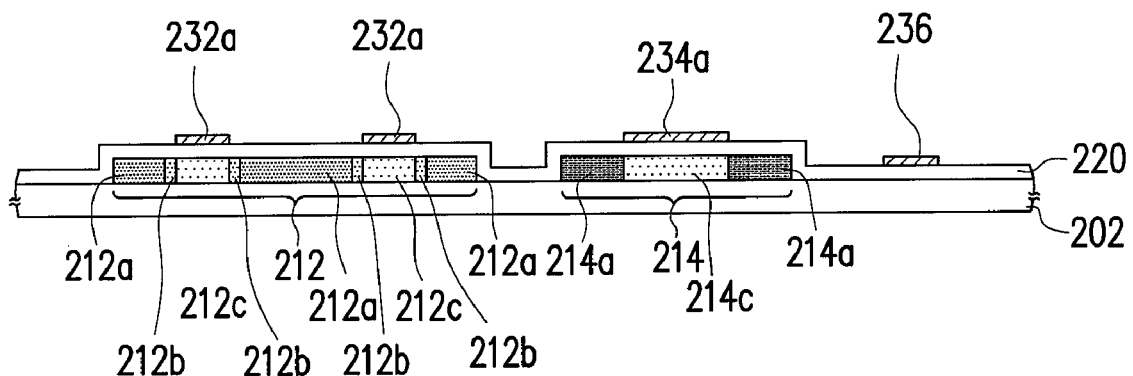
Figure 2L:
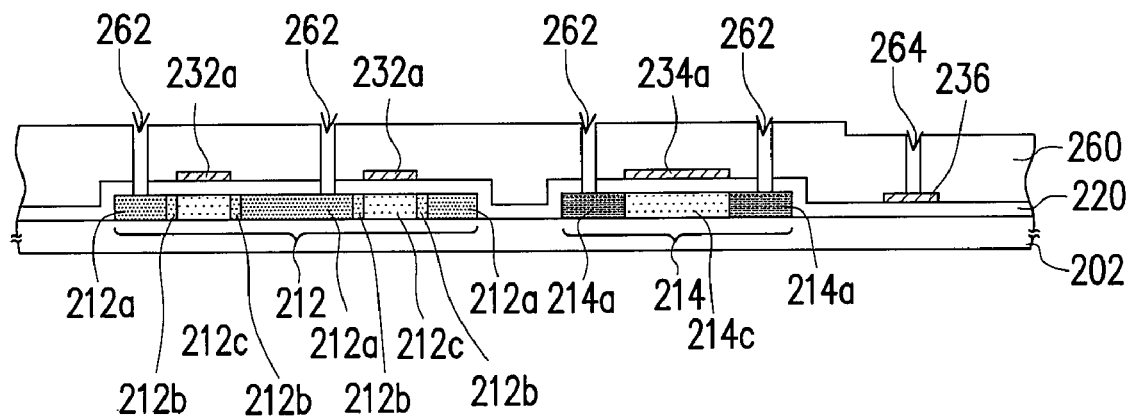
Figure 2M:
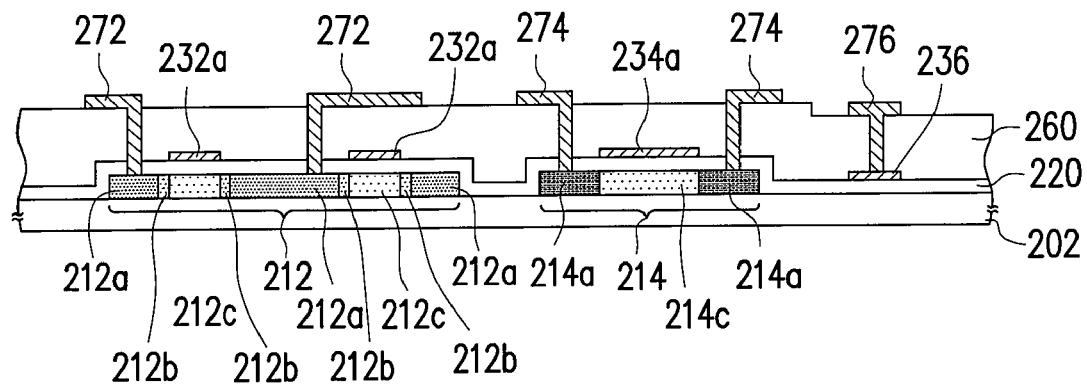
Figure 2N:
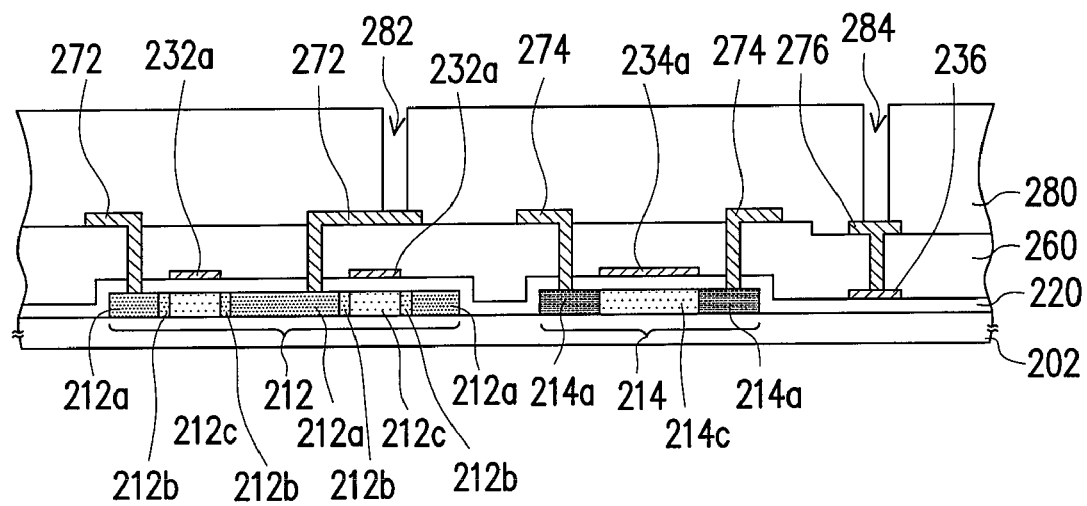
Figure 2O:
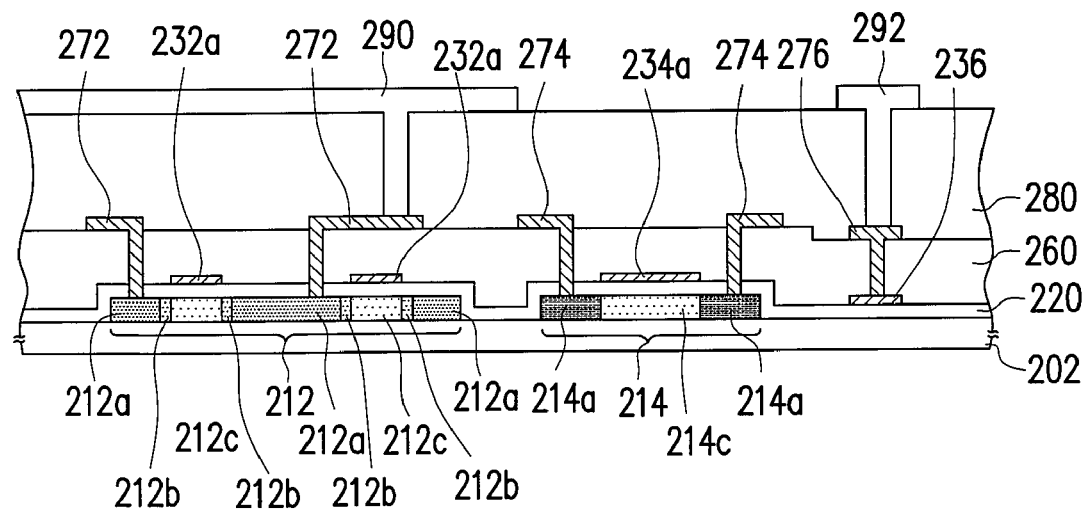

Referring to FIGS. 2A through 2O, which illustrate a manufacturing method of a semiconductor device according to one embodiment of the present invention.

First, as illustrated in FIG. 2A, a substrate 202 is provided, and a first semiconductor pattern 212 and a second semiconductor pattern 214 are formed on the substrate 202. In the present embodiment, the substrate 202 may be a glass substrate, a quartz substrate, a plastic substrate or other suitable transparent substrates. The first semiconductor pattern 212 and the second semiconductor pattern 214 formed thereon may be manufactured by forming an amorphous silicon layer (a-Si layer) first on the substrate 202 and performing a laser annealing process to transform the a-Si layer into a polysilicon layer and then patterning the polysilicon layer. A suitable laser light source of the laser annealing process may be an excimer laser, a solid-state laser, a diode pumped solid state laser (DPSS) and so forth.

It should be noted that the manufacturing method of the present invention may also be performed as a common manufacturing process of a polysilicon TFT where a buffer layer is formed first on the substrate 202 so as to increase adhesion between the substrate 202 and a subsequently formed polysilicon layer and prevent metal ions (such as sodium) in the substrate 202 from diffusing and thereby polluting the polysilicon layer. Furthermore, before performing a laser annealing process, a dehydrogenation process can be performed on the a-Si layer to prevent hydrogen contained therein being heated and leading to a hydrogen explosion during the laser annealing process. People skilled in the art should be able to comprehend the above-mentioned based on the existent level of the prior art, and hence the above-mentioned is not to be further disclosed in the present embodiment.

Thereafter, as illustrated in FIG. 2B, a gate insulation layer 220 and a gate metal layer 230 are sequentially formed on the substrate 202 such that the gate insulation layer 220 and the gate metal layer 230 cover the first semiconductor pattern 212 and the second semiconductor pattern 214. A method of forming the gate insulation layer 220 is, for example, a chemical vapor deposition (CVD) process, and a material of the gate insulation layer 220 may be silicon nitride (SiN) or silicon oxide (SiO). A material of the gate metal layer 230 is, for example, chromium (Cr), aluminum (Al), copper (Cu), molybdenum (Mo) or other low resistance metals, and the gate metal layer 230 may be formed by a sputtering process or other thin film deposition processes. Next, as illustrated in FIG. 2C, a first mask pattern 242 and a second mask pattern 244 are formed on the gate metal layer 230. The first mask pattern 242 is located over the first semiconductor pattern 212 and exposes correspondingly a first source/drain region 212a at two sides of the first semiconductor pattern 212. The second mask pattern 244 is located over the second semiconductor pattern 214 and exposes correspondingly a second source/drain region 214a at two sides of the second semiconductor pattern 214. A method of forming the first mask pattern 242 and the second mask pattern 244 is, for example, performing a photoresist coating process and lithographic processes such as exposure and development on the gate metal layer 230. It should be noted that the TFT structure disclosed in the present embodiment is a dual gate TFT structure adopted to avoid the kink effect and current leakage. Accordingly, the first mask pattern 242 thus formed may have two portions, both located over the first semiconductor pattern 212. Additionally, if an external bonding pad is required over the substrate 202, a third mask pattern 246 can be simultaneously formed on the gate metal layer 230 during this step in the present embodiment.

Afterwards, as illustrated in FIG. 2D, the gate metal layer 230 is patterned using the first mask pattern 242, the second mask pattern 244 and the third mask pattern 246 as masks so as to form a first gate pattern 232, a second gate pattern 234 and a lower bonding pad 236 respectively on the gate insulation layer 220. The patterning action is, for example, accomplished by performing a dry or wet etching process.

Then, as illustrated in FIG. 2E, a first type ion doping process is performed in the first source/drain region 212a and the second source/drain region 214a by using the first mask pattern 242, its corresponding first gate pattern 232, the second mask pattern 244 and its corresponding second gate pattern 234 as masks so that the first source/drain region 212a and the second source/drain region 214a have a first conductive state. The first type ion doping process performed here is, for example, an N-type ion doping process to implant the first source/drain region 212a and the second source/drain region 214a with N-type dopant, such as phosphorous ions. Meanwhile, a first channel region 212c and a second channel region 214c can be defined respectively in the first semiconductor pattern 212 and the second semiconductor pattern 214 under the first gate pattern 232 and the second gate pattern 234.

Next, as illustrated in FIG. 2F, an etching process is performed on the first mask pattern 242 and the second mask pattern 244 to remove a portion of exterior walls of the first mask pattern 242 and the second mask pattern 244 so that a portion of the first gate pattern 232 and a portion of the second gate pattern 234 are exposed. In addition, if the third mask pattern 246 is simultaneously formed in the aforesaid step, the third mask pattern 246 would be etched as well. The etching process performed in the present step is, for example, a dry etching process. More specifically, the first mask pattern 242, the second mask pattern 244 and the third mask pattern 246 may be etched by using plasma (such as oxygen plasma), which is a so-called photoresist ashing process. The photoresist ashing process is characterized by that the first mask pattern 242, the second mask pattern 244 and the third mask pattern 246 may be isotropically etched. For example, after the first mask pattern is etched, not only is a thickness thereof decreased, but two side lengths thereof are also reduced by a same length L1.

Afterwards, as illustrated in FIG. 2G, the first gate pattern 232 and the second gate pattern 234 are etched to form a first gate 232a and a second gate 234a using the first mask pattern 242 and the second mask pattern 244 as masks. Furthermore, a first lightly doped region 212b beside the first source/drain region 212a in the first semiconductor pattern 212 and a second lightly doped region 214b beside the second source/drain region 214a in the second semiconductor pattern 214 are exposed correspondingly. If the third mask pattern 246 is formed and etched simultaneously in the aforesaid step, the step further includes etching a portion of the lower bonding pad 236 using the third mask pattern 246 as a mask. It should be noted that since the first mask pattern 242, the second mask pattern 244 and the third mask pattern 246 are isotropically etched, two sides of the first, second and third mask patterns are reduced inwardly by a symmetrical distance respectively and therefore each of the first lightly doped region 212b and the second lightly doped region 214b thus exposed also has a symmetrical length.

Subsequently, as illustrated in FIG. 2H, a first type ion light doping process is performed in the first lightly doped region 212b and the second lightly doped region 214b by using the first gate 232a and the second gate 234a as masks so that the first lightly doped region 212b and the second lightly doped region 214b have the first conductive state. The aforesaid first type ion doping process is an N-type ion doping process, and the first type ion light doping process corresponding thereto here is, for example, also an N-type ion doping process. The difference between the two N-type ion processes is that the latter first type ion light doping process uses lower concentration N-type dopant, such as phosphorous ions.

In the present embodiment, the first lightly doped region 212b having two sides of symmetrical lengths is manufactured by steps illustrated in FIGS. 2F through 2H. Hence, the misalignment of masks existent in the conventional method of manufacturing a lightly doped drain (LDD) region can be effectively avoided and thereby improving the electrical performance of TFTs.

As illustrated in FIG. 2I, the first mask pattern 242 and the second mask pattern 244 are removed to form another patterned mask layer 250 on the substrate 202. The patterned mask layer 250 exposes the second semiconductor pattern 214 correspondingly. A method of forming the patterned mask layer 250 is, for example, performing a photoresist coating process and lithographic processes such as exposure and development on the gate insulation layer 220.

Additionally, as illustrated in FIG. 2J, a second type ion counter-doping process is performed in the second source/drain region 214a and the second lightly doped region 214b in the second semiconductor pattern 214 using the patterned mask layer 250 as a mask so as to transform ions in the second source/drain region 214a and the second lightly doped region 214b from the first conductive state to a second conductive state. The aforesaid first conductive state is N-type conductive state, while the second conductive state corresponding thereto here is P-type conductive state. Hence, the second type ion doping process performed herein is, for example, a P-type ion doping process to implant the second source/drain region 214a and the second lightly doped region 214b with P-type dopant, such as boron ions. Experiment results indicate that in order to obtain a better effect from a counter-doping process and thereby successfully transform the second source/drain region 214a and the second lightly doped region 214b into the second conductive state, the second type ion doping process and the aforementioned first type ion doping process should implant ions to similar depths.

Afterwards, the patterned mask layer 250 is removed to obtain a semiconductor device structure illustrated in FIG. 2K. The first source/drain 212a, the first lightly doped region 212b, the first channel region 212c and the first gate 232a may constitute an NTFT structure. The second source/drain region 214a, the second lightly doped region 214b, the second channel region 214c and the second gate 234a may constitute a PTFT structure. Two sides of the first lightly doped region 212b have symmetrical lengths, which helps improve the reliability and the electrical performance of devices during operation.

Figure 3A:
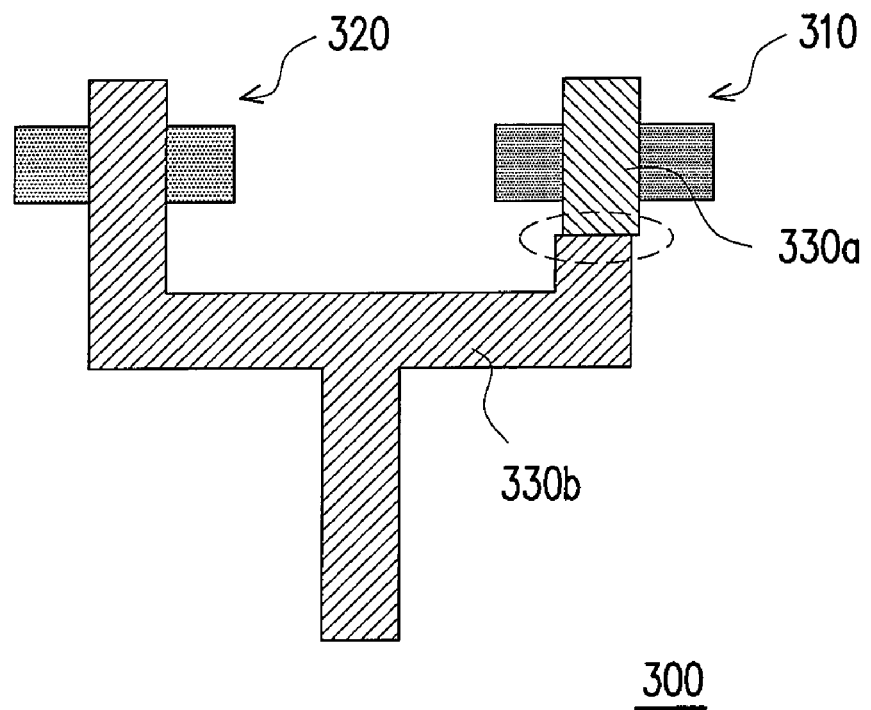
FIG. 3A illustrates a peripheral circuit layout of a liquid crystal display (LCD) panel which the prior art U.S. Pat. No. 6,902,961 will encounter.
Figure 3B:
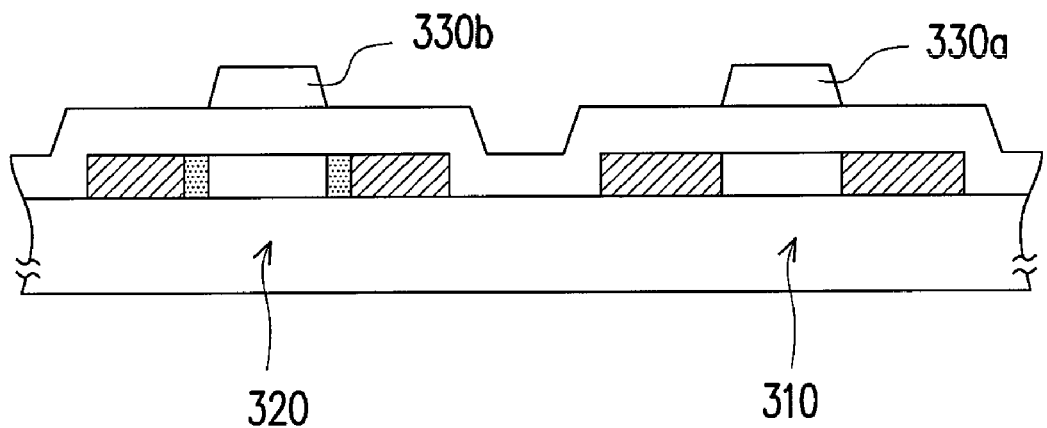
FIG. 3B illustrates a cross-sectional view of the peripheral circuit layout of FIG. 3A.
Figure 3C:
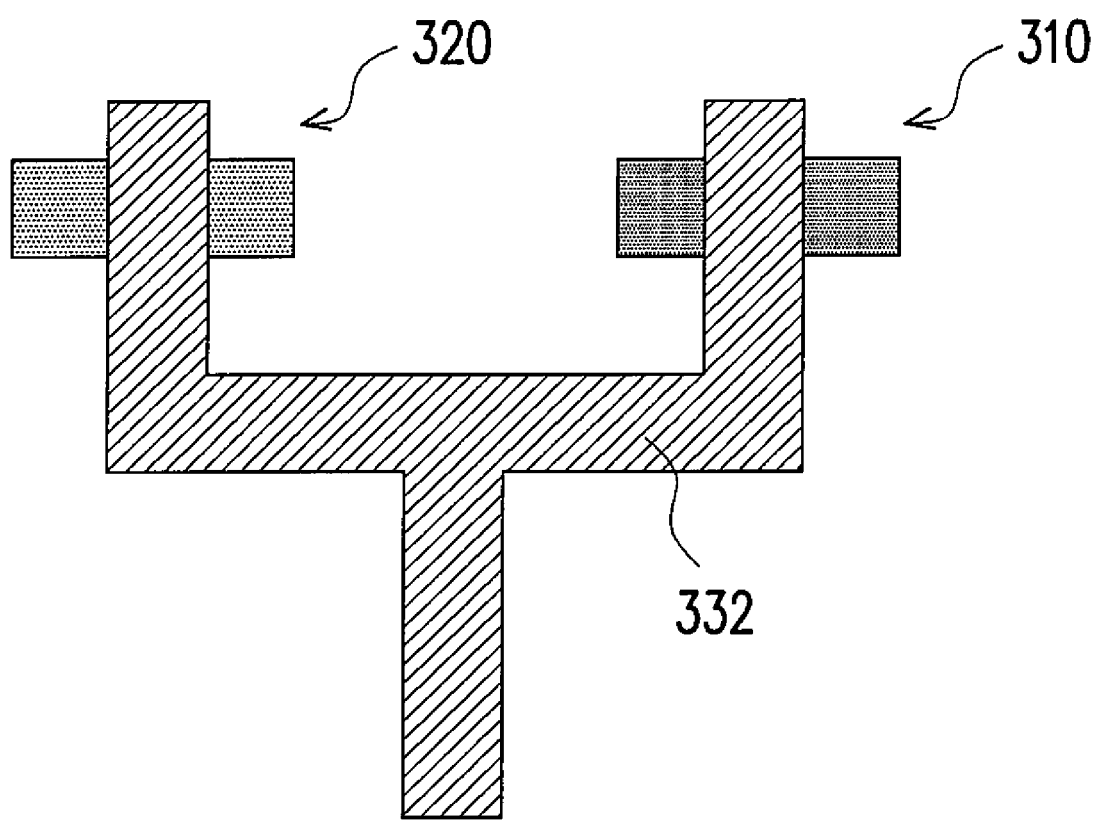
FIG. 3C illustrates a peripheral circuit layout of the present invention.

In another aspect, the same mask process is applied in the present invention to form the first gate pattern 232, the second gate pattern 234 and the lower bonding pad 236, and the mask process is further combined with a counter-doping process to form different types of TFTs, such as PTFTs and NTFTs. Accordingly, compared with the prior art, the present invention has advantages of a simple manufacturing process, a low manufacturing cost and a high processing yield. In more detail, please refer to a peripheral circuit layout of a conventional LCD panel as illustrated in FIGS. 3A and 3B. FIG. 3A illustrates an inverter 300 having a CMOS structure which the prior art U.S. Pat. No. 6,902,961 will encounter, and FIG. 3B illustrates a cross-sectional view of the inverter 300. In the prior art, two different mask processes are applied to manufacture a PTFT 310 and an NTFT 320 when manufacturing the inverter 300, and thus gate metal patterns 330a and 330b respectively defined by the two mask processes may not be properly connected due to the misalignment of the masks and thereby affecting the processing yield and increasing complexity of the manufacturing process. Further, with the misalignment of masks under consideration, when designing a layout for the devices at an early stage, in order to provide a reasonable processing margin, a portion of a layout area has to be sacrificed. Referring to a peripheral circuit layout of the present invention illustrated in FIG. 3C, oppositely, if the manufacturing method of the aforesaid embodiment is adopted, gate metal patterns 332 of the PTFT 310 and the NTFT 320 can be simultaneously defined by the same mask process and thereby overcoming the above-mentioned problems, which helps reduce the number of required masks, lower the manufacturing cost and improve the processing yield.

Following the step illustrated in FIG. 2K, the present embodiment may further proceed with subsequent steps to form elements such as a source/drain contact metal, a pixel electrode and an upper bonding pad.

Referring to FIG. 2L, after removing the patterned mask layer 250, a dielectric layer 260 is further formed on the gate insulation layer 220 to cover the first gate 232a, the second gate 234a and the optionally formed lower bonding pad 236. Moreover, a plurality of first contact windows 262 and a plurality of third contact windows 264 are formed in the dielectric layer 260 and the gate insulation layer 220. The first contact windows expose the first source/drain region 212a of the first semiconductor pattern 212 and the second source/drain region 214a of the second semiconductor pattern 214. The third contact windows 264 expose the lower bonding pad 236. A method of forming the first contact windows 262 and the third contact windows 264 is, for example, performing a lithographic process and a subsequent etching process on the dielectric layer 260.

Subsequently, as illustrated in FIG. 2M, a first source/drain contact metal 272 and a second source/drain contact metal 274 are formed respectively in the first contact windows 262 to electrically connect the first source/drain contact metal 272 and the second source/drain contact metal 274 to the first source/drain region 212a and the second source/drain region 214a correspondingly. In addition, an upper bonding pad 276 may be optionally formed in the third contact windows 264 corresponding to the lower bonding pad 236 simultaneously so as to connect with the lower bonding pad 236. A method of forming the first source/drain contact metal 272, the second source/drain contact metal 274 and the upper bonding pad 276 is, for example, forming a source/drain metal layer (not illustrated) on the dielectric layer 260 first, and then performing a lithographic process and an etching process on the source/drain metal layer. Additionally, a material of the source/drain metal layer can be chosen likewise among Cr, Al, Cu, Mo or other low resistance metals, and the source/drain metal layer is formed by a sputtering process or other thin film deposition processes, for example.

Then, as illustrated in FIG. 2N, a planar layer 280 is formed on the dielectric layer 260 to cover the first source/drain contact metal 272, the second source/drain contact metal 274 and the optionally formed upper bonding pad 276. Further, a second contact window 282 and a fourth contact window 284 are formed in the planar layer 280. The second contact window 282 exposes the first source/drain contact metal 272, and the fourth contact window 284 exposes the upper bonding pad 276. A method of forming the second contact window 282 and the fourth contact window 284 is, for example, performing a lithographic process and a subsequent etching process on the dielectric layer 280.

Afterwards, as illustrated in FIG. 2O, an electrode pattern 290 and a bonding pad pattern 292 are formed on the planar layer 280. The electrode pattern 290 is electrically connected with the first source/drain contact metal 272 through the second contact window 282 to serve as a pixel electrode. The bonding pad pattern 292 is electrically connected with the upper bonding pad 276 through the fourth contact window 284 to serve as the external bonding pad. A method of forming the electrode pattern 290 and the bonding pad pattern 292 is, for example, forming a conductive material layer (not illustrated) on the planar layer 280 and then performing an etching process on the conductive material layer. A material of the conductive material layer is a transparent conductive material, such as indium tin oxide (ITO) or indium zinc oxide (IZO) formed by a sputtering process or other thin film deposition processes, for example.

A semiconductor device structure of the present invention suitable for an LCD panel including a pixel region and a peripheral circuit region is substantially completed up to this step. More embodiments will be described to further illustrate the present invention as follows. Referring to FIGS. 4A through 4J, FIGS. 4A through 4J illustrate a manufacturing method of a semiconductor device according to another embodiment of the present invention. It should be noted that portions of detailed implementing methods of manufacturing processes in the following embodiments are similar to those disclosed by the aforementioned embodiments. Therefore, the relevant illustration can be referred to the aforementioned embodiments and will not be reiterated in the following.

Figure 4A:
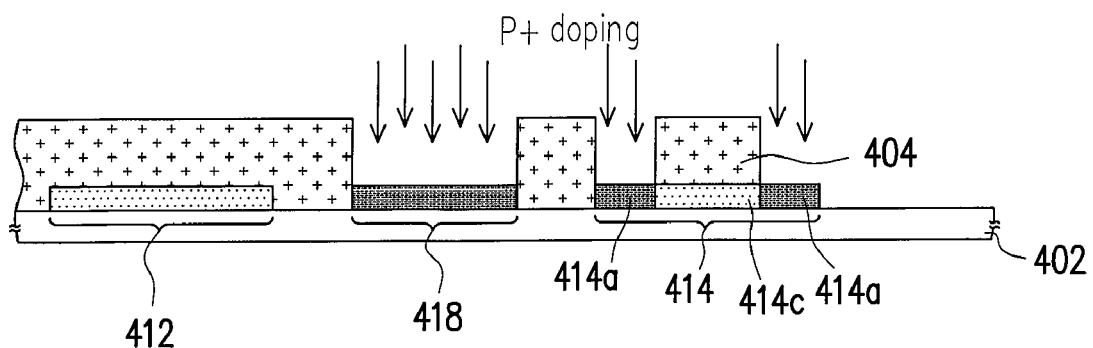
FIGS. 4A through 4J illustrate a manufacturing method of a semiconductor device according to another embodiment of the present invention.

First, as illustrated in FIG. 4A, a substrate 402 is provided and a first semiconductor pattern 412 and a second semiconductor pattern 414 are formed on the substrate 402. A second type doping process is performed on a second source/drain region 414a of the second semiconductor pattern 414 so that the second source/drain region 414a has a second conductive state. In the present embodiment, the substrate 402 may likewise be a glass substrate, a quartz substrate, a plastic substrate or other suitable transparent substrates. The first semiconductor pattern 412 and the second semiconductor pattern 414 are obtained, for example, by forming a polysilicon layer through a laser annealing process and then performing a patterning process on the polysilicon layer. Further, performing a second type ion doping process on the second source/drain region 414a is achieved, for example, by using a photoresist layer 404 as a mask. In this manufacturing method, a storage capacitor and an external bonding pad may be further formed optionally over the substrate 402. Thus, in this step, a third semiconductor pattern 418 can be additionally formed on the substrate 402, and a second type ion doping process may also be performed simultaneously on the third semiconductor pattern 418 such that the third semiconductor pattern 418 has the second conductive state. The second type ion doping process performed here is, for example, a P-type ion doping process to implant the second source/drain region 414a and the third semiconductor pattern 418 with P-type dopant, such as boron ions. Meanwhile, a second channel region 414c can be defined in the second semiconductor pattern 414.

Figure 4B:
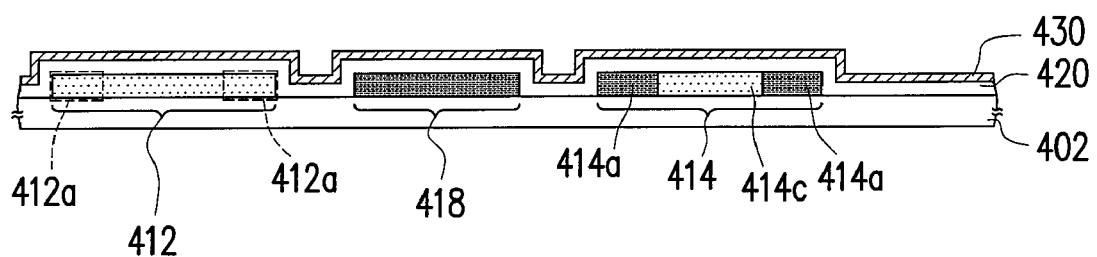

Thereafter, as illustrated in FIG. 4B, a gate insulation layer 420 is formed on the substrate 402 to cover the first semiconductor pattern 412, the second semiconductor pattern 414 and the third semiconductor pattern 418. In addition, a gate metal layer 430 is formed on the gate insulation layer 420. A method of forming the gate insulation layer 420 is, for example, a CVD process, and a material of the gate insulation layer 420 may be SiN or SiO. A material of the gate metal layer 430 is, for example, Cr, Al, Cu, Mo or other low resistance metals, and the gate metal layer 430 may be formed by a process such as a sputtering process or other applicable thin film deposition processes.

Figure 4C:
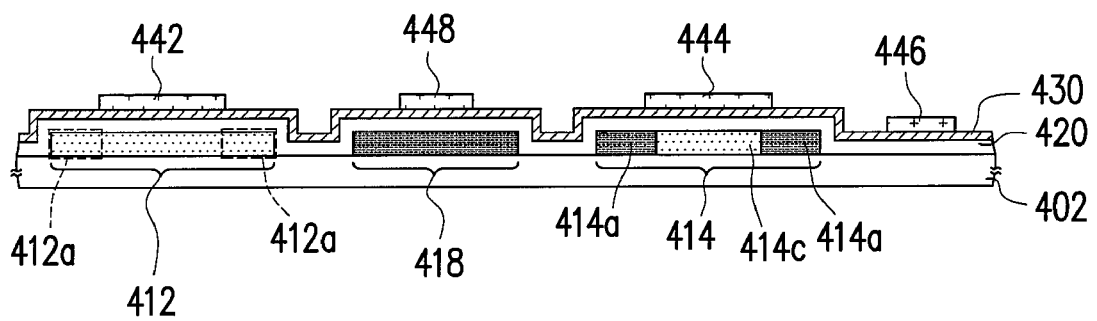

Next, as illustrated in FIG. 4C, a first mask pattern 442 and a second mask pattern 444 are formed on the gate metal layer 430. The first mask pattern 442 is located over the first semiconductor pattern 412 and exposes correspondingly a first source/drain region 412a of the first semiconductor pattern 412. The second mask pattern 444 is located over the second semiconductor pattern 414 and exposes correspondingly a portion of the second source/drain region 414a of the second semiconductor pattern 414. Furthermore, if the storage capacitor and the external bonding pad are optionally formed as described above, a third mask pattern 446 and a fourth mask pattern 448 may be additionally formed in this step on the gate metal layer 430. The fourth mask pattern 448 passes over the third semiconductor pattern 418. A method of forming the first mask pattern 442 and the second mask pattern 444 is, for example, performing a photoresist coating process and lithographic processes such as exposure and development on the gate metal layer 430.

Figure 4D:
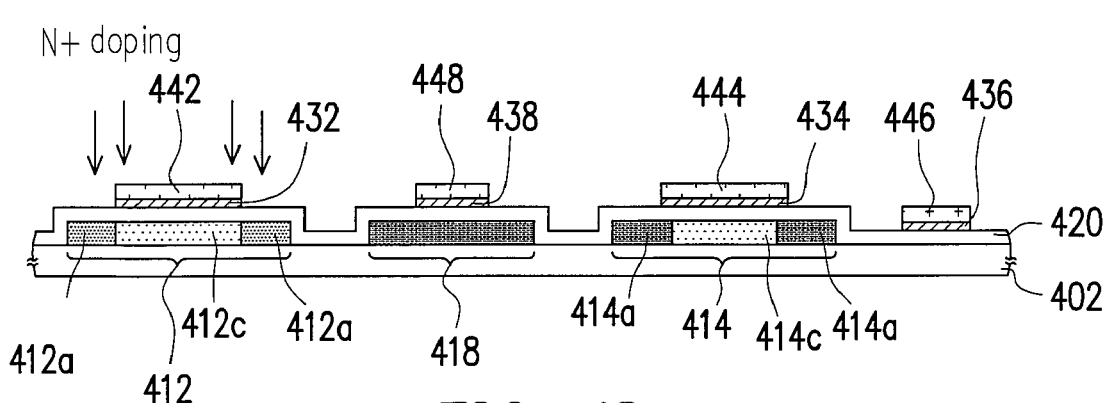

Then, as illustrated in FIG. 4D, the gate metal layer 430 is patterned using the first mask pattern 442, the second mask pattern 444, the third mask pattern 446 and the fourth mask pattern 448 as masks so as to form respectively a first gate pattern 432, a second gate pattern 434, a lower bonding pad 436 and a metal common electrode 438 passing over the third semiconductor pattern 418. Afterwards, a first type ion doping process is performed in the first source/drain region 412a by using the first mask pattern 442 and the first gate pattern 432 as masks so that the first source/drain region 412a has a first conductive state while the second source/drain region 414a retains the second conductive state. The patterning action is accomplished, for example, by performing a dry or wet etching process. The first type doping process performed herein is, for example, an N-type ion doping process to implant the first source/drain region 412a with N-type dopant, such as phosphorous ions. It should be noticed that since the second source/drain region 414a still has to retain the second conductive state after this step, a concentration of the P-type dopant in the aforementioned second type ion doping process should be higher than a concentration of the N-type dopant in the first type ion doping process described herein. Meanwhile, a first channel region 412c can be defined in the first semiconductor pattern 412 under the first gate pattern 432.

Figure 4E:
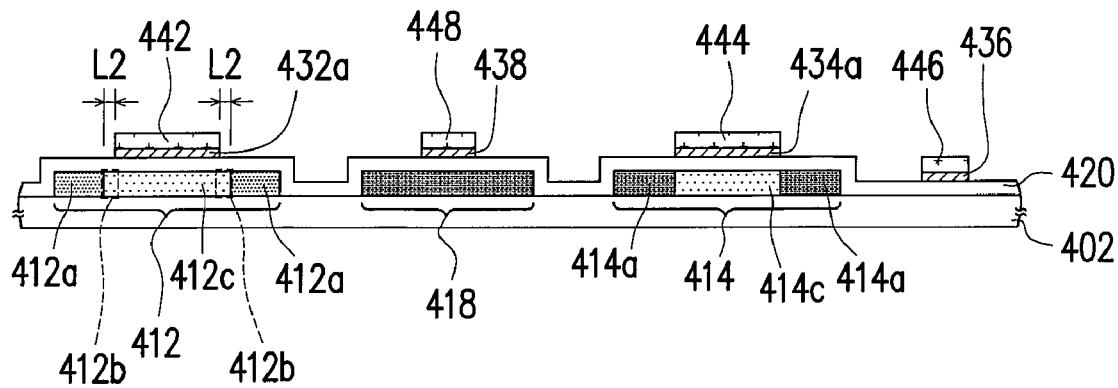

Next, as illustrated in FIG. 4E, an etching process is performed on the first mask pattern 442 and the second mask pattern 444 to remove a portion of exterior walls of the first mask pattern 442 and the second mask pattern 444 so that a portion of the first gate pattern 432 and a portion of the second gate pattern 434 are exposed. Thereafter, the first gate pattern 432 and the second gate pattern 434 are etched to form a first gate 432a and a second gate 434a using the first mask pattern 442 and the second mask pattern 444 as masks after their exterior walls are partially removed. The first gate 432a correspondingly exposes a lightly doped region 412b beside the first source/drain region 412a in the first semiconductor pattern 412. The second gate 434a covers a channel region 414c of the second semiconductor pattern 414 and a portion of the second source/drain region 414b. Moreover, if the third mask pattern 446 and the fourth mask pattern 448 are simultaneously formed in the aforesaid step, the third mask pattern 446 and the fourth mask pattern 448 would be etched as well. The etching process performed in the present step is, for example, a dry etching process. More specifically, the first mask pattern 442, the second mask pattern 444, the third mask pattern 446 and the fourth mask pattern 448 may be etched by the dry etching process using plasma (such as oxygen plasma), which is a so-called photoresist ashing process. The photoresist ashing process is characterized by that the first mask pattern 442, the second mask pattern 444, the third mask pattern 446 and the fourth mask pattern 448 may be isotropically etched. For example, after the first mask pattern 442 is etched, not only is a thickness thereof decreased, but two side lengths thereof are also reduced by a same length L2. The step of etching also includes etching a portion of the lower bonding pad 436 and a portion of the metal common electrode 438 using the third mask pattern 446 and the fourth mask pattern 448 as masks respectively. It should be noted that since the first mask pattern 442 is isotropically etched, a right and a left sides thereof shrink inwardly by symmetrical distances and hence the lightly doped region 412b thus exposed also has a symmetrical length.

Figure 4F:
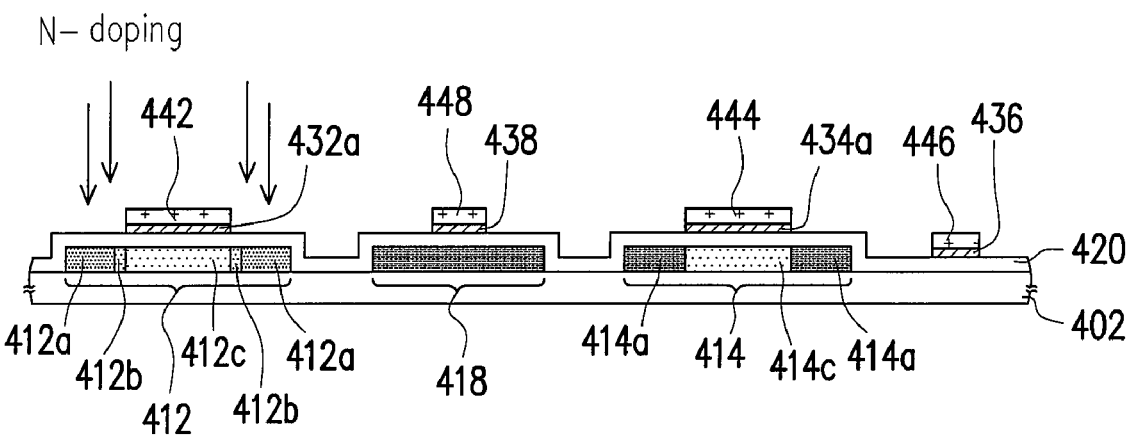

Afterwards, as illustrated in FIG. 4F, a first type ion light doping process is performed in the lightly doped region 412b using the first mask pattern 442 and the first gate 432a corresponding thereto as masks so that the lightly doped region 412b has a first conductive state. The first type ion light doping process performed herein is, for example, likewise an N-type ion doping process. The difference lies in that this first type ion light doping process uses low concentration N-type dopant, such as phosphorous ions. As mentioned above, the second source/drain region 414a still needs to retain the second conductive state after this step. It should be noted that after the second mask pattern 444 and the second gate pattern 434 thereunder are formed (as illustrated in FIG. 4C), they still need to go through a subsequent etching process (as illustrated in FIG. 4E) such that a portion of their thicknesses and a portion of their side lengths are etched. Therefore, in order to ensure that the second channel region 434c under the second gate pattern 434 is not implanted with first type ions, patterns of the second mask pattern 444, the second gate pattern 434 and the subsequently formed second gate 434a must be designed in such a way that they keep covering the second channel region 434c during the aforementioned manufacturing process.

Thus, the first source/drain 412a, the lightly doped region 412b, the first channel region 412c and the first gate 432a may constitute an NTFT structure. The second source/drain region 414a, the second channel region 414c and the second gate 434a may constitute a PTFT structure.

Figure 4G:
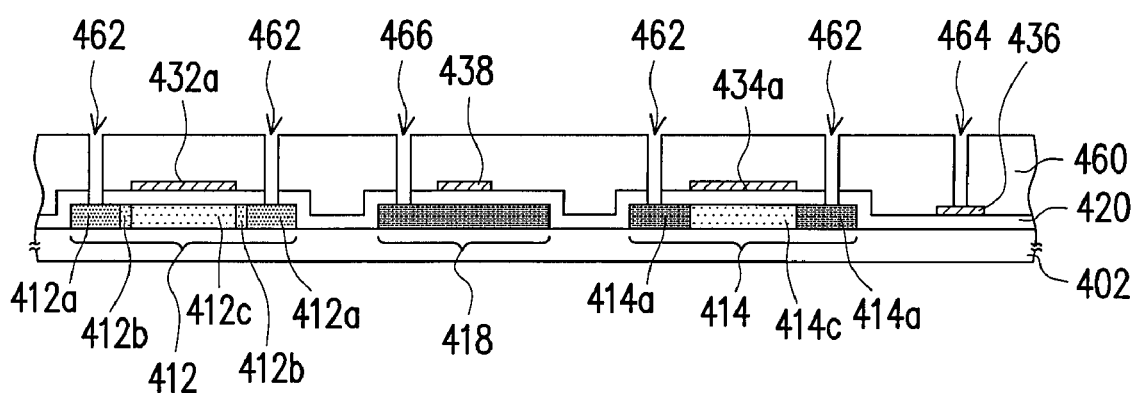

Thereafter, as illustrated in FIG. 4G, the first mask pattern 442, the second mask pattern 444, the third mask pattern 446 and the fourth mask pattern 448 are removed and form a dielectric layer 460 on the gate insulation layer 420 so as to cover the first gate 432a, the second gate 434b, the optionally formed lower bonding pad 436 and the metal common electrode 438. Moreover, a plurality of first contact windows 462, a third contact window 464 and a fifth contact window 466 are formed in the dielectric layer 460 and the gate insulation layer 420. The first contact windows 462 expose the first source/drain region 412a of the first semiconductor pattern 412 and the second source/drain region 414a of the second semiconductor pattern 414. The third contact window 464 exposes the lower bonding pad 436, and the fifth contact window 466 exposes a portion of the third semiconductor pattern 418. A method of forming the first contact windows 462, the third contact window 464 and the fifth contact window 466 is, for example, performing a lithographic process and a subsequent etching process on the dielectric layer 460.

Figure 4H:
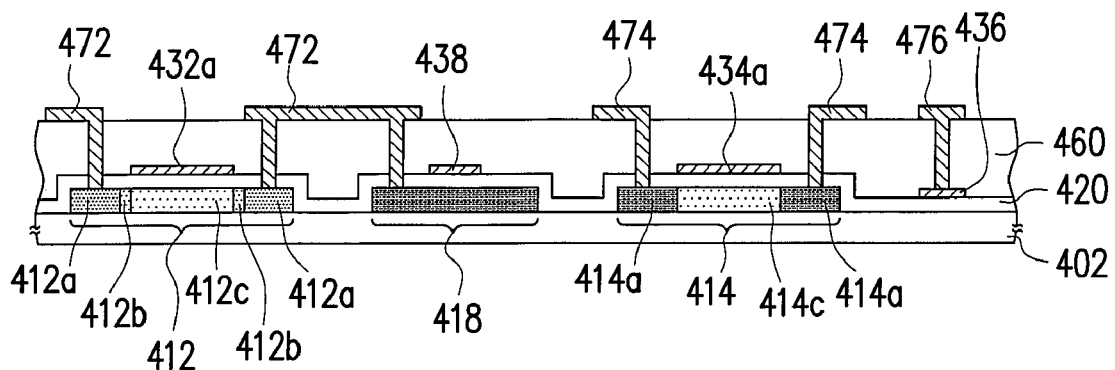

Then, as illustrated in FIG. 4H, a first source/drain contact metal 472 and a second source/drain contact metal 474 are formed in the first contact windows 462, and an upper bonding pad 476 is formed in the third contact window 464. As a result, the first source/drain contact metal 472 and the second source/drain contact metal 474 are electrically connected to the first source/drain region 412a and the second source/drain region 414a correspondingly, and the upper bonding pad 476 is electrically connected to the lower bonding pad 436 through the third contact window 464. Moreover, the first source/drain contact metal 472 is also simultaneously electrically connected to the third semiconductor pattern 418 through the fifth contact window 466 so that the first source/drain region 412a and the third semiconductor pattern 418 are electrically connected with each other. Consequently, when a display signal is introduced from the first source/drain region 412a to the third semiconductor pattern 418, a storage capacitance is formed between the third semiconductor pattern 418 and the metal common electrode 438 thereover. A method of forming the first source/drain contact metal 472, the second source/drain contact metal 474 and the upper bonding pad 476 is, for example, forming a source/drain metal layer (not illustrated) on the dielectric layer 460 first, and then performing a lithographic process and an etching process on the source/drain metal layer. Additionally, a material of the source/drain metal layer can be chosen likewise among Cr, Al, Cu, Mo or other low resistance metals, and the source/drain metal layer is formed by a sputtering process or other thin film deposition processes, for example.

Figure 4I:
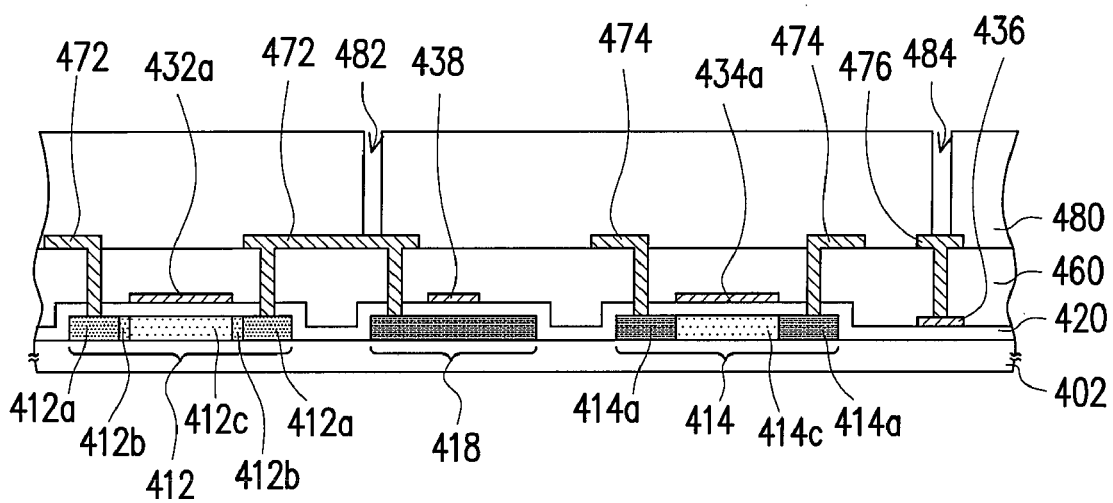

Then, as illustrated in FIG. 4I, a planar layer 480 is formed on the dielectric layer 460 to cover the first source/drain contact metal 472, the second source/drain contact metal 474 and the optionally formed upper bonding pad 476. Further, a second contact window 482 and a fourth contact window 484 are formed in the planar layer 480. The second contact window 482 exposes the first source/drain contact metal 472, and the fourth contact window 484 exposes the upper bonding pad 476. A method of forming the second contact window 482 and the fourth contact window 484 is, for example, performing a lithographic process on the dielectric layer 480.

Figure 4J:
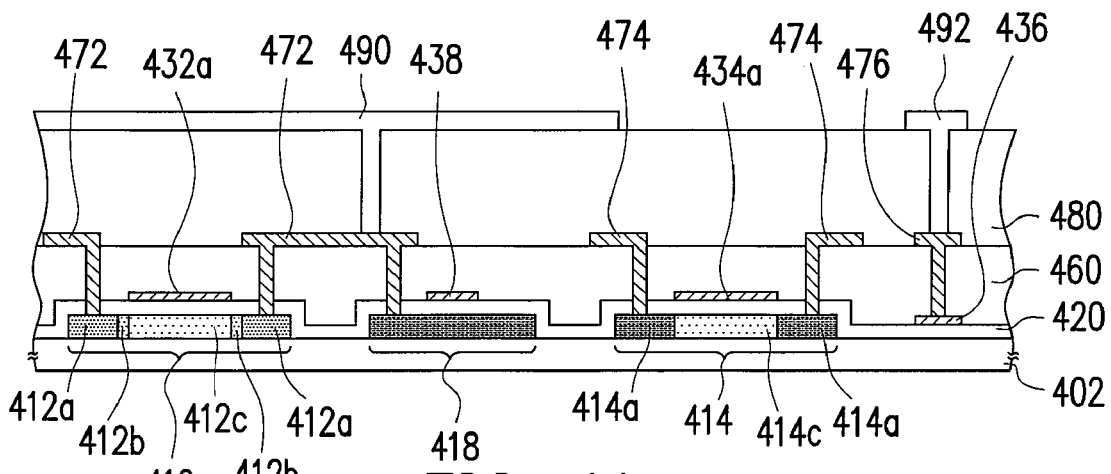

Afterwards, as illustrated in FIG. 4J, an electrode pattern 490 and a bonding pad pattern 492 are formed on the planar layer 480. The electrode pattern 490 is electrically connected to the first source/drain contact metal 472 through the second contact window 482 to serve as a pixel electrode. The bonding pad pattern 492 is electrically connected to the upper bonding pad 476 through the fourth contact window 484 to serve as an external bonding pad. A method of forming the electrode pattern 490 and the bonding pad pattern 492 is, for example, forming a conductive material layer (not illustrated) on the planar layer 480 and then performing an etching process on the conductive material layer. A material of the conductive material layer is a transparent conductive material, such as ITO or IZO, and is formed by a sputtering process or other thin film deposition processes, for example.

The two sides of the lightly doped region in the TFT structure formed in the aforementioned embodiment have symmetrical lengths and therefore help improve the reliability and the electrical performance of the devices during their operation. Moreover, since the same mask process is applied in the aforesaid embodiment to form devices such as gate patterns of different TFTs, the metal common electrode and the lower bonding pad, the misalignment of masks prone to arise in the prior art where the devices are manufactured by different mask processes can be effectively avoided, which helps increase the processing yield, reduce the designable layout area to be sacrificed on the substrate at an early stage of layout designing in the prior art, and thereby lower the manufacturing cost.

In another aspect, the manufacturing of the storage capacitor can be integrated in the aforementioned embodiment. When forming the first semiconductor pattern and the second semiconductor pattern, the third semiconductor pattern can be simultaneously formed to serve as a lower electrode for the storage capacitor and an ion doping process is performed on the third semiconductor pattern to render it conductive. Therefore, the semiconductor device formed in the present embodiment can be coordinated with a good storage capacitor. When applied to an LCD panel, the semiconductor device helps improve the display quality of the LCD panel.

It will be apparent to persons of ordinary art in the art that various modifications and variations can be made to the structure of the present invention without departing from the scope or spirit of the present invention. In view of the foregoing, it is intended that the present invention cover modifications and variations of the present invention provided they fall within the scope of the following claims and their equivalents.

What is claimed is:

1. A manufacturing method of a semiconductor device, comprising:

providing a substrate;

forming a first semiconductor pattern and a second semiconductor pattern on the substrate;

forming sequentially a gate insulation layer and a gate metal layer on the substrate to cover the first semiconductor pattern and the second semiconductor pattern;

forming a first mask pattern and a second mask pattern on the gate metal layer, wherein the first mask pattern is located over the first semiconductor pattern and exposes a first source/drain region of the first semiconductor pattern correspondingly, and the second mask pattern is located over the second semiconductor pattern and exposes a second source/drain region of the second semiconductor pattern correspondingly;

using the first mask pattern and the second mask pattern as masks to pattern the gate metal layer so as to form a first gate pattern and a second gate pattern respectively;

using the first mask pattern, the first gate pattern, the second mask pattern and the second gate pattern as masks to perform a first type ion doping process on the first source/drain region and the second source/drain region so that the first source/drain region and the second source/drain region have a first conductive state;

performing an etching process on the first mask pattern and the second mask pattern to remove a portion of exterior walls of the first mask pattern and the second mask pattern so that a portion of the first gate pattern and a portion of the second gate pattern are exposed;

using the remaining first mask pattern and the remaining second mask pattern as masks to etch the first gate pattern and the second gate pattern so as to form a first gate and a second gate and correspondingly exposing a first lightly doped region beside the first source/drain region in the first semiconductor pattern and a second lightly doped region beside the second source/drain region in the second semiconductor pattern;

using the first gate and the second gate as masks to perform a first type ion light doping process in the first lightly doped region and the second lightly doped region so that the first lightly doped region and the second lightly doped region have a first conductive state;

removing the remaining first mask pattern and the remaining second mask pattern;

forming a patterned mask layer on the substrate, the patterned mask layer exposing correspondingly the second semiconductor pattern;

using the patterned mask layer to perform a second type ion counter-doping process in the second source/drain region and the second lightly doped region so as to transform the conductive state of the second source/drain region and the second lightly doped region from the first conductive state to a second conductive state; and removing the patterned mask layer.

2. The manufacturing method of claim 1, wherein the substrate comprises a glass substrate.

3. The manufacturing method of claim 1, wherein a material of the first semiconductor pattern or the second semiconductor pattern comprises polysilicon.

4. The manufacturing method of claim 1, wherein the first type ion comprises N-type ion and the second type ion comprises P-type ion.

5. The manufacturing method of claim 1, wherein a material of the first mask pattern or the second mask pattern comprises a photoresist material.

6. The manufacturing method of claim 1, wherein a material of the patterned mask layer comprises a photoresist material.

7. The manufacturing method of claim 1, after removing the patterned mask layer, further comprising:

forming a dielectric layer on the gate insulation layer to cover the first gate and the second gate;

forming a plurality of first contact windows in the dielectric layer and the gate insulation layer, the first contact windows exposing the first source/drain region and the second source/drain region; and forming a first source/drain contact metal and a second source/drain contact metal in the first contact windows, the first source/drain contact metal and the second source/drain contact metal electrically connected to the first source/drain region and the second source/drain region correspondingly.

8. The manufacturing method of claim 7, further comprising:

forming a planar layer on the dielectric layer to cover the first source/drain contact metal and the second source/drain contact metal;

forming a second contact window in the planar layer to expose the first source/drain contact metal; and forming an electrode pattern on the planar layer, wherein the electrode pattern is electrically connected to the first source/drain contact metal through the second contact window.

9. The manufacturing method of claim 8, further comprising:

when forming the first mask pattern and the second mask pattern, forming a third mask pattern simultaneously on the gate metal layer; and when using the first mask pattern and the second mask pattern as masks to pattern the gate metal layer, using the third mask pattern as a mask to pattern the gate metal layer simultaneously so as to form a lower bonding pad.

10. The manufacturing method of claim 9, further comprising:

forming the dielectric layer to further cover the lower bonding pad;

when forming the first contact windows, further forming a third contact window in the dielectric layer to expose the lower bonding pad; and when forming the first source/drain contact metal and the second source/drain contact metal, forming an upper bonding pad in the third contact window to connect with the lower bonding pad.

11. The manufacturing method of claim 10, further comprising:

forming the planar layer to further cover the upper bonding pad;

when forming the second contact window, further forming a fourth contact window in the planar layer, the fourth contact window exposing the upper bonding pad; and when forming the electrode pattern on the planar layer, further forming a bonding pad pattern in the fourth contact window to connect with the upper bonding pad.

12. The manufacturing method of claim 1, wherein the etching process is a dry etching process.

13. The manufacturing method of claim 12, wherein oxygen plasma is used in the etching process to etch the first mask pattern and the second mask pattern.

14. A manufacturing method of a semiconductor device, comprising:

providing a substrate;

forming a first semiconductor pattern and a second semiconductor pattern on the substrate;

performing a second type ion doping process in a second source/drain region of the second semiconductor pattern so that the second source/drain region has a second conductive state;

forming a gate insulation layer on the substrate to cover the first semiconductor pattern and the second semiconductor pattern after performing the second type ion doping process;

forming a gate metal layer on the gate insulation layer;

forming a first mask pattern and a second mask pattern on the gate metal layer, wherein the first mask pattern is located over the first semiconductor pattern and exposes a first source/drain region of the first semiconductor pattern correspondingly, and the second mask pattern is located over the second semiconductor pattern and exposes a portion of the second source/drain region of the second semiconductor pattern correspondingly;

using the first mask pattern and the second mask pattern as masks to pattern the gate metal layer so as to form a first gate pattern and a second gate pattern respectively;

using the first mask pattern and the first gate pattern as masks to perform a first type ion doping process in the first source/drain region so that the first source/drain region has a first conductive state while the second source/drain region retains the second conductive state;

performing an etching process on the first mask pattern and the second mask pattern to remove a portion of exterior walls of the first mask pattern and the second mask pattern so that a portion of the first gate pattern and a portion of the second gate pattern are exposed;

using the first mask pattern and the second mask pattern as masks to etch the first gate pattern and the second gate pattern so as to form a first gate and a second gate, wherein the first gate correspondingly exposes a lightly doped region beside the first source/drain region in the first semiconductor pattern, and the second gate covers a channel region of the second semiconductor pattern and a portion of the second source/drain region;

using the first gate as a mask to perform a first type ion light doping process in the lightly doped region such that the lightly doped region has the first conductive state while the second source/drain region still retains the second conductive state; and removing the first mask pattern and the second mask pattern.

15. The manufacturing method of claim 14, wherein the step of performing the first type ion doping process in the first source/drain region further comprises performing the first type ion doping process in a portion of the second source/drain region and the portion of the second source/drain region still needs to retain the second conductive state.

16. The manufacturing method of claim 14, wherein the step of performing the first type ion doping process in the lightly doped region further comprises performing the first type ion light doping process in a portion of the second source/drain region and the portion of the second source/drain region still needs to retain the second conductive state.

17. The manufacturing method of claim 14, further comprising:

when forming the first semiconductor pattern and the second semiconductor pattern, forming a third semiconductor pattern simultaneously on the substrate;

when performing the second type ion doping process in the second source/drain region, performing the second type ion doping process simultaneously on the third semiconductor pattern so that the third semiconductor pattern likewise has the second conductive state;

when forming the first mask pattern and the second mask pattern, forming a fourth mask pattern on the gate metal layer simultaneously, wherein the fourth mask pattern passes over the third semiconductor pattern;

when using the first mask pattern and the second mask pattern as masks to pattern the gate metal layer, using the fourth mask pattern as a mask to pattern the gate metal layer simultaneously so as to form a metal common electrode, wherein the metal common electrode passes over the third semiconductor pattern;

forming the dielectric layer to further cover the metal common electrode;

when forming the first contact windows, further forming a fifth contact window in the dielectric layer and the gate insulation layer to expose the third semiconductor pattern; and forming the first source/drain contact metal to further connect with the third semiconductor pattern through the fifth contact window.

18. The manufacturing method of claim 14, wherein the substrate comprises a glass substrate.

19. The manufacturing method of claim 14, wherein a material of the first semiconductor pattern or the second semiconductor pattern comprises polysilicon.

20. The manufacturing method of claim 14, wherein the first type ion comprises N-type ion and the second type ion comprises P-type ion.

21. The manufacturing method of claim 14, wherein a material of the first mask pattern or the second mask pattern comprises a photoresist material.

22. The manufacturing method of claim 14, further comprising:

forming a dielectric layer on the gate insulation layer to cover the first gate and the second gate;

forming a plurality of first contact windows in the dielectric layer and the gate insulation layer, the first contact windows exposing the first source/drain region and the second source/drain region; and forming a first source/drain contact metal and a second source/drain contact metal in the first contact windows, the first source/drain contact metal and the second source/drain contact metal electrically connected to the first source/drain region and the second source/drain region correspondingly.

23. The manufacturing method of claim 22, further comprising:

forming a planar layer on the dielectric layer to cover the source/drain contact metals;

forming a second contact window in the planar layer to expose the first source/drain contact metal; and forming an electrode pattern on the planar layer, wherein the electrode pattern is electrically connected to the first source/drain contact metal through the second contact window.

24. The manufacturing method of claim 23, further comprising:

when forming the first mask pattern and the second mask pattern, forming a third mask pattern simultaneously on the gate metal layer; and when using the first mask pattern and the second mask pattern as masks to pattern the gate metal layer, using the third mask pattern as a mask simultaneously to pattern the gate metal layer so as to form a lower bonding pad.

25. The manufacturing method of claim 24, further comprising:

forming the dielectric layer to further cover the lower bonding pad;

when forming the first contact windows, further forming a third contact window in the dielectric layer to expose the lower bonding pad; and when forming the first source/drain contact metal and the second source/drain contact metal, forming an upper bonding pad in the third contact window to connect with the lower bonding pad.

26. The manufacturing method of claim 25, further comprising:

forming the planar layer to further cover the upper bonding pad;

when forming the second contact window, further forming a fourth contact window in the planar layer to expose the upper bonding pad; and when forming the electrode pattern on the planar layer, further forming a bonding pad pattern in the fourth contact window to connect with the upper bonding pad.

27. The manufacturing method of claim 14, wherein the etching process is a dry etching process.

28. The manufacturing method of claim 27, wherein oxygen plasma is used in the etching process to etch the first mask pattern and the second mask pattern.

29. A semiconductor device, comprising:

a substrate;

a first semiconductor pattern, disposed on the substrate and having a first channel region, a first source/drain region located at two sides of the first channel region, and a symmetrical lightly doped region located between the first channel region and the first source/drain region, wherein the first source/drain region and the lightly doped region have a first conductive state;

a second semiconductor pattern, disposed on the substrate and having a second channel region and a second source/drain region located at two sides of the second channel region, wherein the second source/drain region has a second conductive state;

a gate insulation layer, disposed on the substrate and covering the first semiconductor pattern and the second semiconductor pattern;

a first gate, disposed on the gate insulation layer, wherein the first gate is located over the first semiconductor pattern and exposes the first source/drain region and the lightly doped region correspondingly;

a second gate, disposed on the gate insulation layer and located over the second semiconductor pattern to cover the second channel region and a portion of the second source/drain region;

a dielectric layer, disposed on the gate insulation layer and covering the first gate and the second gate, the dielectric layer having a plurality of first contact windows therein to expose the first source/drain region and the second source/drain region;

a first source/drain contact metal and a second source/drain contact metal, disposed in the first contact windows and electrically connected to the first source/drain region and the second source/drain region correspondingly;

a planar layer, disposed on the dielectric layer and covering the first source/drain contact metal and the second source/drain contact metal, the planar layer having a second contact window therein for exposing the first source/drain contact metal;

an electrode pattern, disposed on the planar layer and coupled to the first source/drain contact metal through the second contact window; and a lower bonding pad disposed on the gate insulation layer.

30. The semiconductor device of claim 29, wherein the dielectric layer further has a third contact window for exposing the lower bonding pad.

31. The semiconductor device of claim 29, wherein the substrate comprises a glass substrate.

32. The semiconductor device of claim 29, wherein a material of the first semiconductor pattern or the second semiconductor pattern comprises polysilicon.

33. The semiconductor device of claim 29, wherein the first conductive state is an N-type conductive state, and the second conductive state is a P-type conductive state.

34. The semiconductor device of claim 30, further comprising an upper bonding pad disposed in the third contact window and electrically connected with the lower bonding pad.

35. The semiconductor device of claim 34, wherein the planar layer further has a fourth contact window for exposing the upper bonding pad.

36. The semiconductor device of claim 35, further comprising a bonding pad pattern disposed in the fourth contact window and electrically connected with the upper bonding pad.

37. The semiconductor device of claim 29, further comprising a third semiconductor pattern disposed on the substrate and covered by the gate insulation layer, the third semiconductor pattern having the second conductive state.

38. The semiconductor device of claim 37, wherein the third semiconductor pattern is coupled to the first source/drain region.

39. The semiconductor device of claim 38, further comprising a metal common electrode disposed on the gate insulation layer and passing over the third semiconductor pattern.

* * * * *